United States Patent
Mattia

(10) Patent No.: US 6,493,848 B1
(45) Date of Patent: Dec. 10, 2002

(54) RATE EQUATION METHOD AND APPARATUS FOR SIMULATION OF CURRENT IN A MOS DEVICE

(75) Inventor: John-Paul Mattia, Basking Ridge, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/433,702

(22) Filed: Nov. 3, 1999

(51) Int. Cl.[7] ................................................ G06F 17/50
(52) U.S. Cl. ..................................... 716/4; 716/5; 716/6
(58) Field of Search ................. 716/1–18; 702/117–120; 342/522, 523, 615, 765–769

(56) References Cited

U.S. PATENT DOCUMENTS 5,687,355 A * 11/1997 Joardar et al. ................. 716/20
6,275,059 B1 * 8/2001 Sah et al. ...................... 324/765

* cited by examiner

*Primary Examiner*—Matthew Smith
*Assistant Examiner*—Naum Levin

(57) ABSTRACT

An improved method for modeling electrical behavior in a MOSFET semiconductor device is disclosed wherein a rate equation qualitatively predicts electrical behavior, including electron migration and current, across a boundary imposed by the difference in doping the source and the channel. Quantitative values of the electrical behavior are skewed when doping levels in the device are unknown. However, the qualitative result may be used, regardless of knowledge of the doping levels, to design MOSFET devices which exhibit more desirable electric behavior. The rate equation may further be used to simulate the behavior of a MOSFET device in a computer simulation program. Because mobility and diffusion factors, which break down with shrinking gate dimensions, are eliminated from the instant rate equation, the electrical behavior of smaller devices is simpler to calculate than with classical rate equations.

14 Claims, 4 Drawing Sheets

US 6,493,848 B1

RATE EQUATION METHOD AND APPARATUS FOR SIMULATION OF CURRENT IN A MOS DEVICE

FIELD OF THE INVENTION

The present invention relates generally to measuring electrical behavior in semi-conductor devices and relates more particularly, to simulating current in MOSFET devices based on an improved barrier model rate equation.

BACKGROUND OF THE INVENTION

The trend in modern semiconductor manufacturing has been to produce semiconductor chips in ever-decreasing sizes. This, in turn, allows electrical components, such as computers, cellular telephones, compact disc players and the like, to be made smaller and more compact as well as faster in operation. The miniaturization of electrical components is deemed to be advantageous in the sale and marketing of the same, since consumers tend to prefer smaller components over similarly priced, yet bulkier models.

In order to achieve this overall miniaturization, it becomes necessary to create smaller versions of the internal elements that make up these electrical components. Much attention has been directed to creating smaller, more densely-packed transistors in order to create, for example, smaller microprocessors as well as other semiconductor chips. In order to design such smaller transistors, it is preferable to be able to model and simulate the behavior of a theoretical design prior to its manufacture.

A semiconductor device, such as a MOSFET, having a source region, a gate region, a drain region and a channel region associated with it, have been successfully modeled in the past. However, as the device is made smaller, the dimensions of these associated regions necessarily decrease. As channel lengths shrink in particular, it has been realized that classical transport concepts, such as drift, diffusion, or other quantities become less reliable. Consequently, the transport equations used to model these devices, and which rely on these factors, are of limited accuracy. Thus they lose their useful in the simulation and design of smaller MOSFETs.

Thus, there is a need to develop an improved model for simulating electrical behavior in semiconductor devices, such as MOSFETs, which provides accurate and useful results, while discounting factors such as electron mobility, diffusion and velocity which become unreliable for modeling in smaller devices.

SUMMARY OF THE INVENTION

The instant invention demonstrates the viability of modeling the current in a short-channel MOSFET without the use of mobility, diffusion or classical electron velocity. Such a model is useful where the uncertainty in the velocity of electrons that traverse the channel becomes comparable to the saturation velocity of electrons in the device. This unfavorable characteristic is present in silicon-based metal-oxide semiconductor field-effect transistors (MOSFETs) currently manufactured. The instant rate-equation model is particularly useful for short-channel MOSFETs, where comparable transport equations have not previously been applied. Results, including current-voltage (I-V) characteristics generated by the instant rate equation (or barrier model), compare well qualitatively to experimental data, as well as to results from electrical device computer simulation programs such as PADRE or SPICE. Furthermore, the instant barrier model replicates features of the current-voltage curve that are often ascribed to variations in the mobility, although mobility is not included in the rate equation.

According to a first aspect of the instant invention, a method for determining a current-voltage characteristic for a semiconductor device having a source region, a drain region and a channel region, comprises: assigning one of a plurality of fixed values to each of at least one of a plurality of model variables including a gate-to-source voltage ($V_{GS}$) to be applied to the device, a drain-to source voltage ($V_{DS}$) to be applied to the device, a first Fermi level ($F_1$) corresponding to the source region of the device, a second Fermi level ($F_2$) corresponding to the channel region of the device, a width (W) of the channel region, an operating temperature (T) of the device, a quantization energy level ($E_{qv}$) of the device, a height (Vo) of a source-channel barrier of the device, and a mass in a z-direction for electrons in a channel valley ($m_{zv}$); assigning a plurality of differing values for each of the remaining model variables; and determining, for each of the plurality of differing values, a current value ($I_{12}$) from a rate equation modeled after the source-channel barrier. In the above variables, the subscript v denotes a particular valley, and z denotes the direction along the width of the channel.

According to a second aspect of the instant invention, a computer-readable medium encoded with processing instructions is disclosed for implementing a method, performed by a computer, for simulating current-voltage behavior in a semiconductor device having a source region, a channel region and a drain region, the method comprising: receiving an input including one of a plurality of fixed values for each of at least one of a plurality of model variables including a gate-to-source voltage ($V_{GS}$) to be applied to the device, a drain-to source voltage ($V_{DS}$) to be applied to the device, a first Fermi level ($F_1$) corresponding to the source region of the device, a second Fermi level ($F_2$) corresponding to the channel region of the device, a width (W) of the channel region, an operating temperature (T) of the device, a quantization energy level ($E_{qv}$) of the device, a height (Vo) of a source-channel barrier of the device, and a mass in a z-direction for electrons in a channel valley ($m_{zv}$); assigning a plurality of differing values for each of the remaining model variables; and determining, for each of the plurality of differing values, a current value ($I_{12}$) from a rate equation modeled after the source-channel barrier.

According to a third aspect of the instant invention, an apparatus for simulating current-voltage behavior in a semiconductor device having a source region, a channel region and a drain region, comprises: a processor; a memory connected to the processor, the memory storing a program to control the operation of the processor; and the processor operative with the program to: receive an input including one of a plurality of fixed values for each of at least one of a plurality of model variables including a gate-to-source voltage ($V_{GS}$) to be applied to the device, a drain-to source voltage ($V_{DS}$) to be applied to the device, a first Fermi level ($F_1$) corresponding to the source region of the device, a second Fermi level ($F_2$) corresponding to the channel region of the device, a width (W) of the channel region, an operating temperature (T) of the device, a quantization energy level ($E_{qv}$) of the device, a height (Vo) of a source-channel barrier of the device, and a mass in the z-direction for electrons in a channel valley ($m_{zv}$); assign a plurality of differing values for each of the remaining model variables; and determine, for each of the plurality of differing values, a current value ($I_{12}$) from a rate equation modeled after the source-channel barrier.

BRIEF DESCRIPTION OF THE DRAWINGS

Further aspects and embodiments of the instant invention will become apparent upon review of the following detailed description when taken in conjunction with the attached figures, of which.

DETAILED DESCRIPTION OF THE INVENTION

Disclosed herein is a new method of calculating the current in a short-channel MOS device. The results of the disclosed method have been favorably compared against conventional simulation programs, as well as with actual measurements taken from n-type MOS devices.

For MOS devices having a source, channel and drain, such as metal oxide semiconductor field effect transmitters, problems arise when trying to model electrical behavior in devices with smaller channels. The problem is traced directly to an increasing uncertainty in the channel velocity, $\Delta v$, of electrons as channel lengths shrink. This difficulty can be demonstrated by outlining the calculation of $\Delta v$.

To determine whether an electron is in the source, channel, or drain, the maximum physical uncertainty in the location of its wave packet, $\Delta x$, is the channel length L. Since the classical distribution function is specified by the simultaneous position (x) and momentum (p) of electrons in the channel, $\Delta x$ must in fact be much less than the gate length. The velocity of an electron is calculated as p/m, where m is the effective mass of the electron. Thus, $\Delta v$ must equal $\Delta p/m$. Incorporating the Heisenberg relation, it is found that the minimum $\Delta v$ is $\hbar/m\Delta x$. Accordingly, if $\Delta v$ is plotted against gate length in a standard two-dimensional graph, it is easily demonstrated that the uncertainty in $\Delta v$ increases as gate length L decreases. Thus, classical models which have relied on smaller uncertainties in $\Delta v$ break down as channel length decreases.

Figure 1:
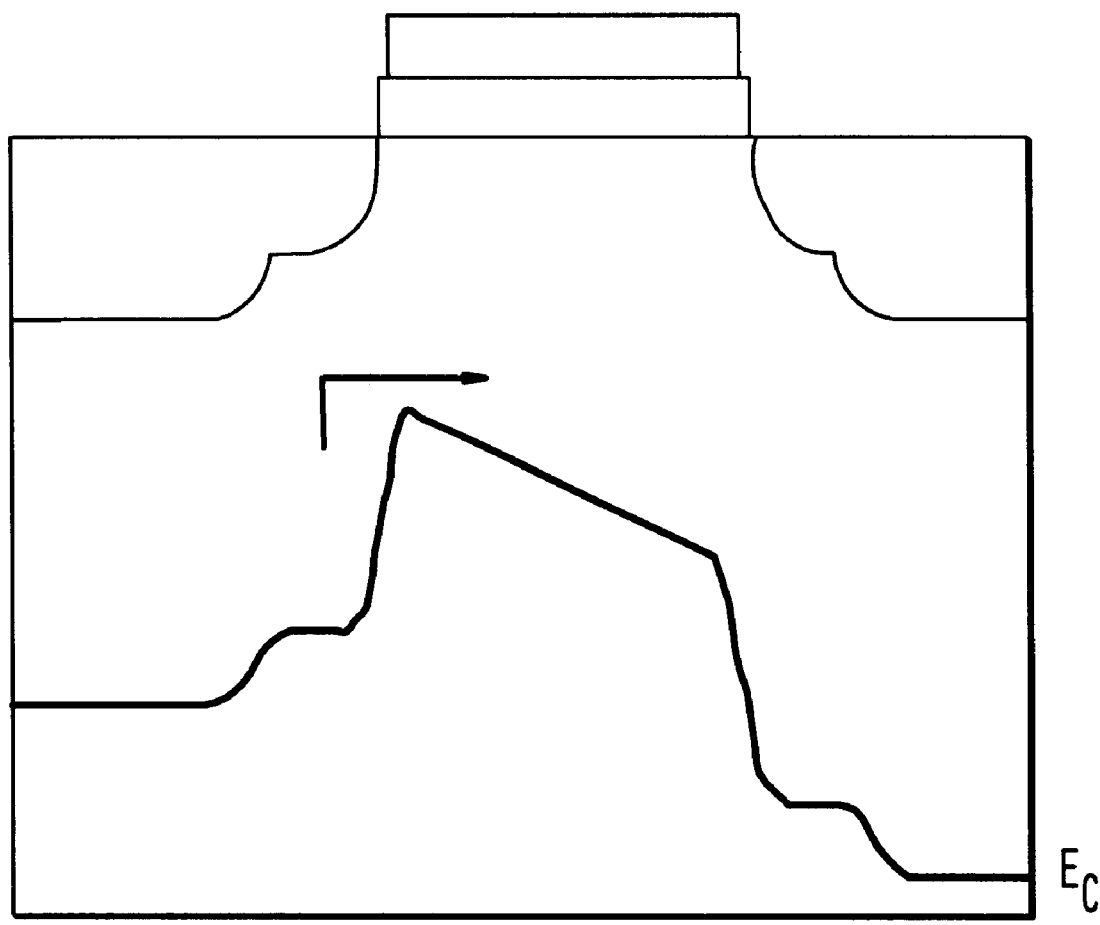
FIG. 1 is a schematic view of a source-channel barrier of a semiconductor device to be modeled, including an exemplary plot of a conduction band $E_c$ in a direction parallel to the direction of current flow.
Figure 1:
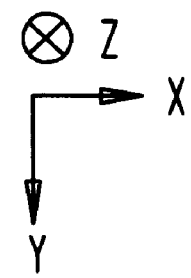

The barrier model rate equation of the present invention avoids the above difficulty. In this approach, it is assumed that the rate-limiting step in electron transport in a MOS device is the jump across the source-channel barrier shown schematically in FIG. 1. This barrier arises because of the doping difference between source and channel. A barrier model rate equation of the present invention is then derived generally according to the following principles: First, the mean rate of electron transfer from a state in the source to a state in the channel is proportional to the probability that the initial state is occupied and the final state is empty. Next, both forward and reverse current velocity are calculated, whereafter it is demonstrated that their proportionality constants are related. The total current is then found by summing over all possible pairs of transitions across the barrier. This formulation results in a current that depends exponentially on the source-channel barrier height, which then becomes a parameter that must be precisely known. Mobility and diffusion are not incorporated into the model due to their reliance on $\Delta v$, which as demonstrated above, is undesirable in small channel MOS devices. However, characteristics of MOS devices attributed to these factors are still demonstrated in the model.

For example, results from the barrier model rate equation disclosed below have been compared to results from the device simulator PADRE, and data from 200-micron wide MOS devices with gate lengths between 0.1 and 0.25 microns. These results have shown that the dominant features of the resulting current-voltage characteristic according to the barrier model qualitatively agree with the results of the PADRE simulator. However, as FIGS. 4(a)–4(c) demonstrate, there is some quantitative discrepancy due to uncertainty in the dopant concentration of the device that was tested. Although the simplified model disclosed herein produces an incorrect magnitude for the current, it yields useful analytical results that produce physical insight into the behavior of MOS devices. Such qualitative characteristics are useful, for example, in simulating a MOS device design prior to manufacture.

Figure 2:
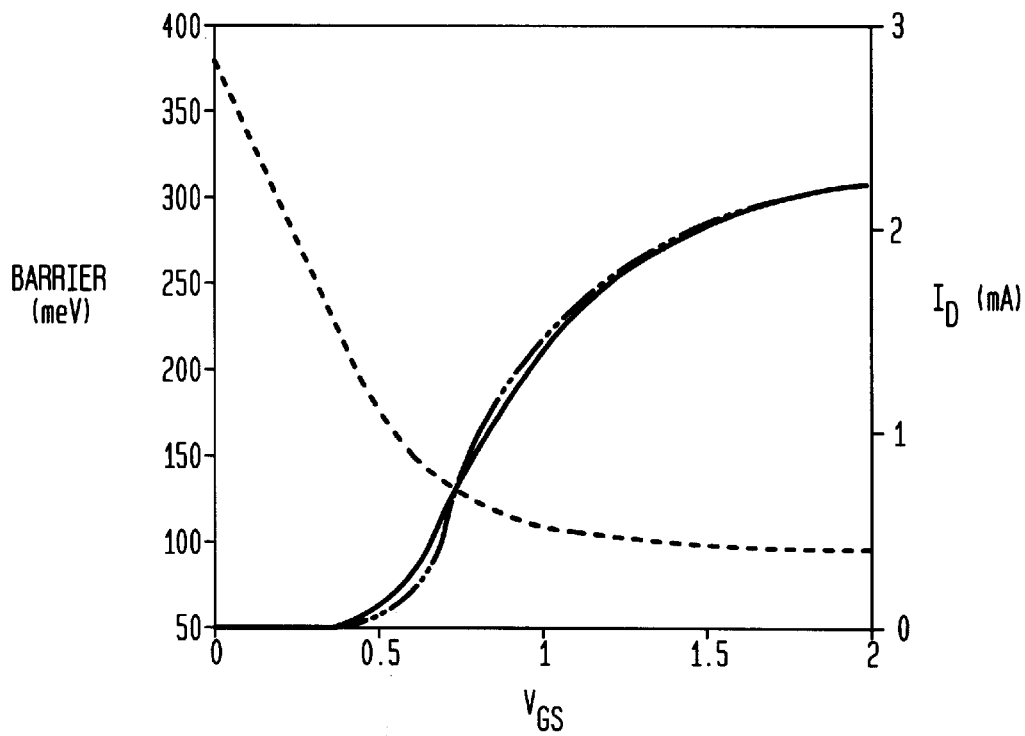
FIG. 2 is a plot of an exemplary source-channel barrier height, the resulting current predicted by the barrier model of the instant invention and the current predicted by computer simulations of the prior art, plotted as a function of gate-source voltage ($V_{GS}$) wherein source-drain voltage ($V_{DS}$) is held at a constant value.

FIG. 2 displays a two-dimensional graph of an I-V characteristic generated through a PADRE simulation and by the instant model. The source-channel barrier height vs. gate bias ($V_{gs}$) from PADRE is plotted as a dashed line. This value was used to calculate the current in the barrier, which is plotted as a solid line in FIG. 2. The value of the current from PADRE, shown by a dot-dashed line in FIG. 2, is scaled by a constant factor (of approximately 5) in order to show the similarity of the curves as predicted by the PADRE simulation and the instant model. The graph reveals that the saturating behavior of the barrier height with increasing $V_{gs}$ causes the current to saturate. This effect is conventionally ascribed to a reduction in mobility due to increased interface roughness scattering. Thus, the barrier model demonstrates the physical characteristics ascribed to mobility without taking such factor into account explicitly.

Figure 3:
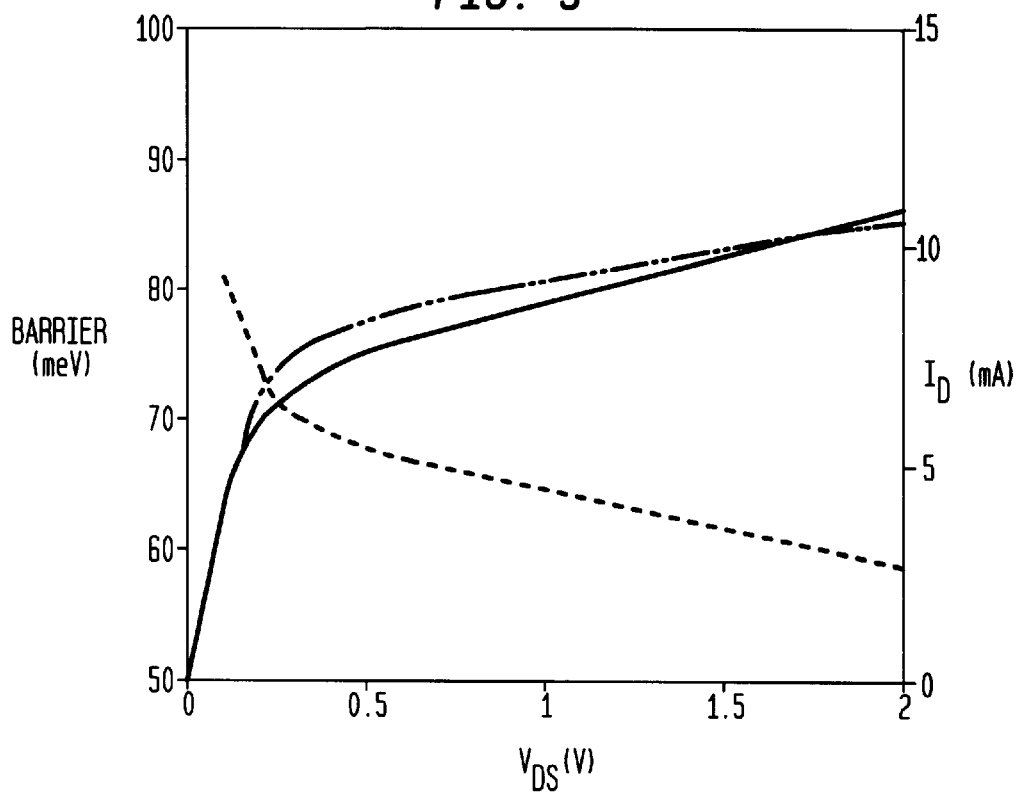
FIG. 3 is a plot of an exemplary source-channel barrier height, the resulting current simulated by the barrier model of the instant invention and the current simulated by a computer simulation program of the prior art, each plotted as a function of drain-source voltage ($V_{DS}$) wherein gate-source voltage ($V_{GS}$) is held at a constant value.

In FIG. 3, the same three quantities are plotted as a function of drain bias $V_{ds}$. Again, there is qualitative agreement between the model and the simulators of the prior art. The dashed line is the value of the barrier height from PADRE, the solid line is the resulting current in the barrier model, and the dot-dashed line is the calculated current from PADRE. In the barrier model, the output conductance corresponds to the degree to which the drain bias changes the barrier height.

Figure 4A:
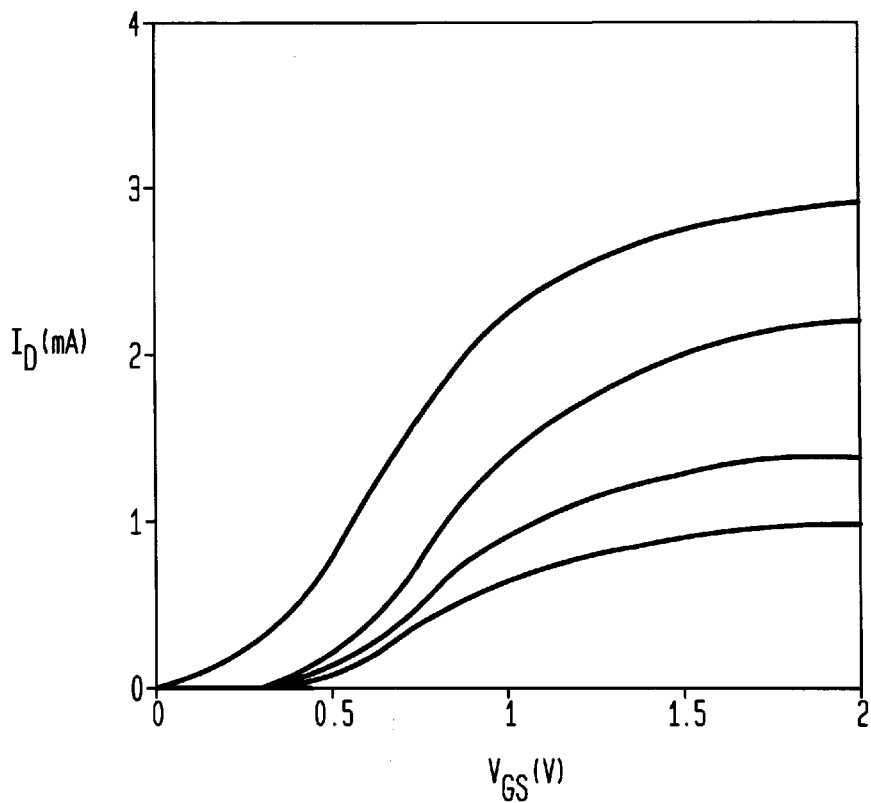
FIGS. 4(a)–4(c) depict a family of current-voltage characteristics as simulated by the barrier model of the instant invention, as measured from an actual MOSFET device, and as simulated by a computer simulation program of the prior art.
Figure 4B:
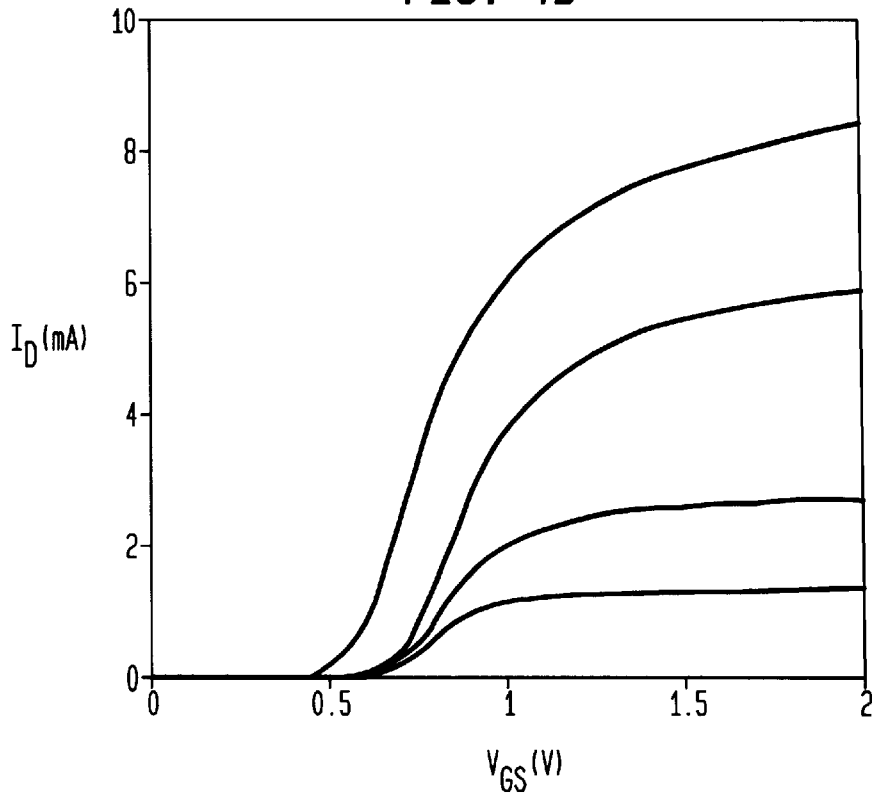
Figure 4C:
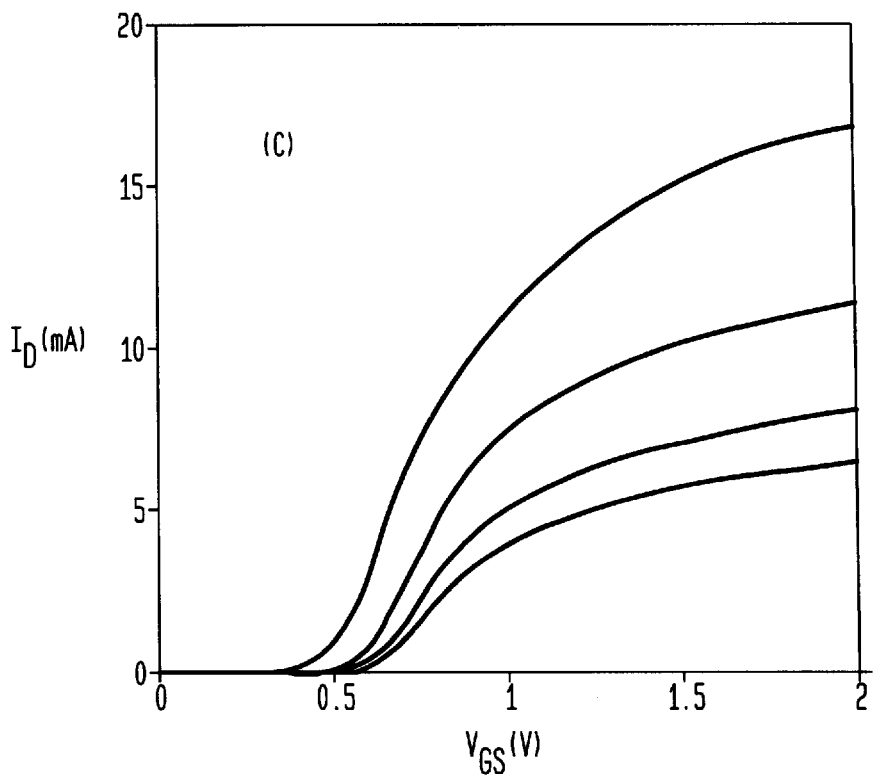

Calculations for the barrier-dominated model and actual measurements of $I_d$ vs. $V_{ds}$ are shown in FIGS. 4(a) and (b), respectively, for devices with gate widths of 200 microns, and gate lengths of 0.10, 0.15, 0.20 and 0.25 microns. The PADRE-calculated currents are shown in FIG. 4(c). In the tests performed, there was some uncertainty as to the activated concentration of dopants in the device, and therefore the barrier height was estimated with some factor of quantitative uncertainty. More accurate knowledge of this parameter would improve the quantitative agreement between the barrier model and the data.

In summary, a new method of calculating the current in a short-channel MOS device has been developed. The barrier model yields a current that depends exponentially on the source-channel barrier height and produces qualitatively correct behavior despite several simplifying assumptions. The resulting analytical expression is of a complexity that would be suitable for circuit analysis.

The derivation of the model is as follows. A MOS device under bias has the band structure shown schematically in FIG. 1. As stated before, there is a barrier which forms due to the difference in doping between the source and the channel. Since the current must be continuous, the current can be calculated at a point near the barrier in the channel. Electrons that have left the source and are traveling in the channel will quickly accelerate to saturated velocities when the source-drain bias is significant. As a consequence, electron transport is quite rapid in the channel. However, before the electron reaches the source-drain field region, it must traverse from the source into the channel. Assuming the electrons in the source are thermally distributed, some number of electrons will have an insufficient amount of energy to traverse the barrier. Others will have a minimum energy, and then there will be an exponential decrease as the energy is increased in the number of carriers.

Since the electrons are relatively close to the band edge at this point, an electron's velocity can be written as $\hbar \underline{k}_x/m_x^*$, where $\underline{k}$ is a wave vector associated with an electron and having components $\underline{k}_x$, $\underline{k}_y$, and $\underline{k}_z$. (See FIG. 1 for the direction definitions). Since $\underline{k}_z$ can be arbitrarily small, some electrons will take an arbitrarily long time to traverse the barrier. Others which are higher in energy will cross more rapidly, but very few will traverse the barrier at the saturated velocity.

Unless otherwise noted and as used herein, the following barrier model variables have the following meanings:

$I_{12}$ means the current from the source region to the channel region;

q refers to the known electron charge constant (~1.602× $10^{-19}$ coulombs);

$\hbar$ refers to the known modified Planck constant ((~6.62× $10^{-27}$ erg sec.)/2 π);

k refers to the known Boltzmann constant (~1.38×$10^{-16}$ erg/° C.)

T comprises an absolute temperature (in degrees Kelvin);

e comprises the base of natural logarithms;

$F_1$ comprises a Fermi distribution of the source region;

$F_2$ comprises a Fermi distribution of the channel region;

$E_{qv}$ comprises an energy of quantization for the channel region;

Vo comprises a source-channel barrier height; and $m_{zv}$ comprises a mass in the z-direction for electrons in the channel valley.

As stated previously, since the current through the device must be continuous, a calculation of the rate of traversal of electrons over the barrier is equivalent to calculating the current through the device. It is then necessary to consider the rate at which electrons go from region 1 to region 2, which are the region to the left and right, respectively, of the barrier in FIG. 1. Electrons in both regions are quantized in a y-direction (i.e. a direction vertical to the barrier), and it is assumed that electrons further conserve $\underline{k}_z$ due to phase matching. From this, the total rate of electrons going from region 1 to region 2, $R_{1-2}$ is given by:

$$R_{1-2} = (W/2\pi^2)\sum_v \int d\underline{k}_x d\underline{k}_z (\hbar \underline{k}_x/m_{xv}) f_1 (1-f_2)$$

where W is the width of the device, $f_n$ is the occupation of the state with energy corresponding to $\hbar$ and $\underline{k}$, in region n. The summation over the valley region (v) accounts for the different band minima and different sub-bands in the potential well at the surface. The reverse mechanism $R_{-2-1}$ is then:

$$R_{-2-1} = (W/2\pi^2)\sum_v \int d\underline{k}_x d\underline{k}_z (\hbar \underline{k}_x/m_{xv}) f_2 (1-f_1)$$

It will be assumed that the electrons in region 1 are in quasi-equilibrium with the source. The electrons in region 2 are being swept into the channel, so it follows that they have a different Fermi level from electrons in region 1. Depending on the transition rate back and forth across the barrier, these approximation will have varying degrees of accuracy. However, within the limit of this model, all electrons crossing the barrier from region 1 to region 2 continue on into the channel.

For energy conserving transitions, the total current flowing becomes:

$$I_{12} = (qW/2\pi^2)\sum_v \int d\underline{k}_x d\underline{k}_z (\hbar \underline{k}_x/m_{xv})(f_1-f_2)$$

The occupation factors may be expanded as $$f_1-f_2 = (1-e^{(F2-F1)/kT})/(1+e^{(F2-F1)/kT}+e^{(F2-E)/kT}+e^{(E-F1)/kT})$$

Note again that the Fermi level in region 2 is much less than that in region 1 when the channel is under bias. Alternatively, it can be said that the states that the electrons are entering once crossing the barrier are essentially unoccupied. In this case, the denominator of the above equation is dominated by $e^{(E-F1)/kT}$. The total current is then approximated by:

$$I_{12} \approx (2qW/(2\pi)^2)\left(1-e^{(F2-F1)/kT}\right)\sum_v \int d\underline{k}_x d\underline{k}_z (\hbar \underline{k}_x/m_{xv}) e^{(F1-E)/kT}$$

The energy of the electron is described by:

$$E = E_{qv} + V_o + (\hbar^2/2)((\underline{k}_x^2/m_{xv})+(\underline{k}_z^2/m_{zv}))$$

where $E_{qv}$ is the energy of quantitization for the v valley. Using this expression for the energy, the integral becomes:

$$I_{12} = (2qW\hbar/(2\pi)^2)\left(1-e^{(F2-F1)/kT}\right)\sum_v \left(e^{(F1-Eqv-Vo/kt)}/m_{xv}\right)$$
$$\int_{-\infty}^{\infty}\int_0^{\infty} d\underline{k}_x d\underline{k}_z \underline{k}_z \exp[(-\hbar_x^2/2kT)((\underline{k}_x^2/m_{xv}) + (\underline{k}_z^2/m_{zv}))]$$

The integral is carried out over all values of $\underline{k}_z$, but only the positive values of $\underline{k}_x$, since this value relates to the component of momentum necessary to carry the electron over the barrier and into the channel. After the integration is carried out, the final expression for the current is found:

$$I_{12} = 2qW/\hbar^2(kT/2\pi)^{3/2}[1-e^{(F^2-F^1)/kT}]\Sigma e^{(F^1-E^{qv}-V^o)/kT}\sqrt{m_{zv}},$$

It should be noted first that the symbols q, $\hbar$, and k each represent known scientific constants. The variable e is a mathematical constant. Also, W and T represent physical variables which are readily calculated in conventional manners. Finally, $F_1$, $F_2$, $E_{qv}$, $V_o$ and $m_{zv}$ are all theoretical values readily calculable according to equations well known in the art. This barrier model rate equation thus becomes simple to use in circuit analysis for determining, inter alia, a current-voltage characteristic of a proposed MOS device. Through use of the instant model, the qualitative characteristic of such a device may be determined reliably without first manufacturing the device. Thus, through successive applications of the above equation, a designer may input a plurality of different variables into the above equation to achieve a desirable I-V characteristic for a contemplated MOS device. It is contemplated that such derivations may readily be performed on a computer.

Figure 5:
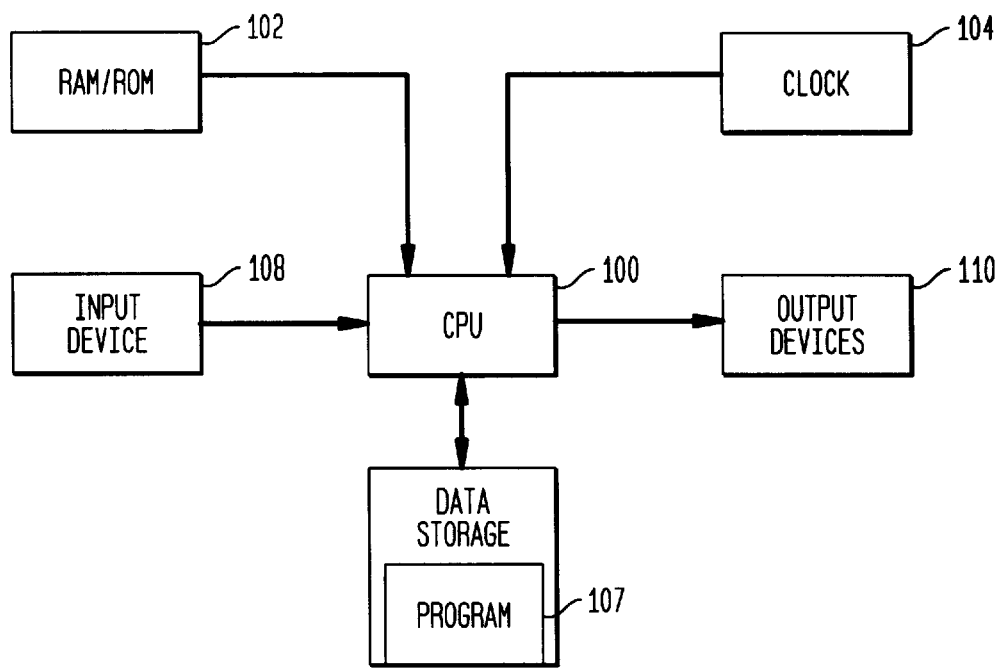
FIG. 5 is a schematic block diagram of a computer system programmed to run simulations according to the barrier model of the instant invention.

Turning now to FIG. 5, depicted therein is a computer system 90, the hardware configuration of which is presently available. Computer system 90 is operative to receive program instructions and user inputs, and is further operative to output results corresponding to such instructions and inputs in accordance with the present invention. Computer system 90 comprises a central processing unit (processor) 100 which may be any commonly available microprocessor such as the PENTIUM III manufactured by INTEL CORP. Processor 100 is operatively connected to RAM/ROM 102, clock 104, data storage device 106 (which stores program 107), input device(s) 108 and output device(s) 110.

Random-access memory (RAM) may be a suitable number of Single In-line Memory Module (SIMM) chips having a storage capacity (typically measured in megabytes) sufficient to store, inter alia, processing instructions utilized by processor 100 during operation of computer system 90. Read-only memory (ROM) may be any permanent memory medium capable of storing, inter alia, processing instructions performed by processor 100 during a start-up routine of computer system 90. Further functions of RAM/ROM 102 will be apparent to one of ordinary skill in the art.

Clock 104 may be an on-board component of processor 100 which dictates a clock speed (typically measured in MHz) at which processor 100 performs and synchronizes communication between hardware components of computer system 90. Further functions of clock 104 will be apparent to one of ordinary skill in the art.

Input device(s) 108 may be one or more commonly known devices used for communicating information to computer system 90 via either another computer system or by user inputs. Accordingly, input device(s) 108 may include a keyboard, a mouse, a graphics tablet, a scanner, a voice recognition unit, a parallel or serial communication port, a network connection and any appropriate network or other communication card for receiving data. Input device(s) 108 is/are operative to allow a user to input instructions and values in accordance with the present invention.

Output device(s) 110 may be one or more commonly known devices used by computer system 90 to communicate the results of inputted instructions and values to a user of computer system 90. Accordingly, output device(s) 110 may include a display monitor, a voice synthesizer, a printer, a parallel or serial communication port, a network connection and any appropriate network or other communication card for sending data. Output device(s) 110 is/are operative to allow a user to receive the results of input instructions and values in accordance with the present invention.

Data storage device 106 may be either an internal or external large capacity memory for storing computer data, the storage capacity of which is typically measured in gigabytes. Data storage device 106 stores, inter alia, an operating system such as WINDOWS NT by MICROSOFT CORP, and one or more application programs, such as program 107. Accordingly, data storage device 106 may be one or more of the following: a floppy disk drive, a hard disk drive, a CD-ROM disk and reader/writer, a DVD disk and reader/writer, a ZIP disk and a ZIP drive of the type manufactured by IOMEGA CORP., and/or any other computer readable medium that may be encoded with processing instructions in a read-only or read-write format. Further functions of and available devices for data storage device 106 will be apparent to one of ordinary skill in the art.

Program 107 includes a plurality of processing instructions which enables computer system 90 to receive inputs of data and information and determine voltage-current characteristics of a MOS device in accordance with the present invention. Program 107 may be written in any conventional computer language that is comprehensible to computer system 90, such as C++. Program 107 preferably includes processing instructions allowing computer system 90 to accept inputs of barrier model variables and/or to select appropriate values for the barrier model variables. Program 107 also preferably includes processing instructions allowing computer system 90 to determine the results for each of the variety of input and selected variables, the results including a current value for each of the input values that results from the barrier model rate equation disclosed herein. Finally, program 107 preferably includes processing instructions allowing computer system 90 to generate an I-V characteristic of an MOS device exhibiting properties represented by the input variables. Such an I-V characteristic is typically a plot of a curve of current values versus voltage values on a standard two dimensional graph, as exemplified in FIGS. 4(a)–4(c). The I-V characteristic may be presented to a user via any of the output device(s) 110 contemplated for use with a computer system 90.

While the embodiment of the invention shown and described is fully capable of achieving the results desired, it is to be understood that this embodiment has been shown and described for purposes of illustration only and not for purposes of limitation. Other variations in the form and details that occur to those skilled in the art and which are within the spirit and scope of the invention are not specifically addressed. Therefore, the invention is limited only by the appended claims.

What is claimed is:

1. A method for determining a current-voltage characteristic for a semiconductor device having a source region, a drain region and a channel region, the method comprising:

assigning one of a plurality of fixed values to each of at least one of a plurality of barrier model variables including a gate-to-source voltage ($V_{GS}$) to be applied to the device, a drain-to source voltage ($V_{DS}$) to be applied to the device, a first Fermi level ($F_1$) corresponding to the source region of the device, a second Fermi level ($F_2$) corresponding to the channel region of the device, a width (W) of the channel region, an operating temperature (T) of the device, a quantization energy level ($E_{qv}$) of the device, a height (Vo) of a source-channel barrier of the device, and a mass in a z-direction for an electron in a valley ($m_{zv}$);

assigning a plurality of differing values for each of the remaining barrier model variables; and the barrier model being free of reliance on transport phenomena, including electron mobility, diffusion and velocity as variables;

determining, for each of the plurality of differing values, a current value ($I_{12}$) from a rate equation modeled after the source-channel barrier.

2. The method according to claim 1, further comprising: determining a current-voltage characteristic from a plurality of determined current values ($I_{12}$) and a plurality of voltage values.

3. The method according to claim 2, wherein the plurality of voltage values comprise a plurality of values for the gate-to-source voltage ($V_{GS}$).

4. The method according to claim 3, wherein the value of the drain-to-source voltage ($V_{DS}$) is held constant.

5. The method according to claim 2, wherein the plurality of voltage values comprise a plurality of values for the drain-to-source voltage ($V_{DS}$).

6. The method according to claim 5, wherein the value of the gate-to-source voltage ($V_{GS}$) is held constant.

7. The method of claim 2, further comprising:
deriving a second current-voltage characteristic by assigning a second one of a plurality of fixed values to each of at least one of a plurality of model variables; and
assigning a plurality of differing values for each of the remaining model variables.

8. The method of claim 1, wherein the device is a metal-oxide semiconductor field-effect transistor.

9. A method for determining a current-voltage characteristic for a semiconductor device having a source region, a drain region and a channel region, the method comprising:
assigning one of a plurality of fixed values to each of at least one of a plurality of barrier model variables including a gate-to-source voltage ($V_{GS}$) to be applied to the device, a drain-to source voltage ($V_{DS}$) to be applied to the device, a first Fermi level ($F_1$) corresponding to the source region of the device, a second Fermi level ($F_2$) corresponding to the channel region of the device, a width (W) of the channel region, an operating temperature (T) of the device, a quantization energy level ($E_{qv}$) of the device, a height (Vo) of a source-channel barrier of the device, and a mass in a z-direction for an electron in a valley ($m_{zv}$);
assigning a plurality of differing values for each of the remaining barrier model variables; and
determining, for each of the plurality of differing values, a current value ($I_{12}$) from a rate equation modeled after the source-channel barrier;
wherein the rate equation comprises:

$$I_{12} = 2qW/\hbar^2 (kT/2\Pi)^{3/2} \Sigma e^{(F_1 - E^{qv} - V^o)/kT} \sqrt{m_{zv}}.$$

10. A computer-readable medium encoded with processing instructions for implementing a method, performed by a computer, for simulating current-voltage behavior in a semiconductor device having a source region, a channel region and a drain region, the method comprising:
receiving an input including one of a plurality of fixed values for each of at least one of a plurality of model variables including a gate-to-source voltage ($V_{GS}$) to be applied to the device, a drain-to source voltage ($V_{DS}$) to be applied to the device, a first Fermi level ($F_1$) corresponding to the source region of the device, a second Fermi level ($F_2$) corresponding to the channel region of the device, a width (W) of the channel region, an operating temperature (T) of the device, a quantization energy level ($E_{qv}$) of the device, a height (Vo) of a source-channel barrier of the device, and a mass in a z-direction for an electron in a channel valley ($m_{zv}$);
assigning a plurality of differing values for each of the remaining model variables;
the model being free of reliance on transport phenomena, including electron mobility, diffusion and velocity as variables; and
determining, for each of the plurality of differing values, a current value ($I_{12}$) from a rate equation modeled after the source-channel barrier.

11. A computer-readable medium encoded with processing instructions for implementing a method, performed by a computer, for simulating current-voltage behavior in a semiconductor device having a source region, a channel region and a drain region, the method comprising:
receiving an input including one of a plurality of fixed values for each of at least one of a plurality of model variables including a gate-to-source voltage ($V_{GS}$) to be applied to the device, a drain-to source voltage ($V_{DS}$) to be applied to the device, a first Fermi level ($F_1$) corresponding to the source region of the device, a second Fermi level ($F_2$) corresponding to the channel region of the device, a width (W) of the channel region, an operating temperature (T) of the device, a quantization energy level ($E_{qv}$) of the device, a height (Vo) of a source-channel barrier of the device, and a mass in a z-direction for an electron in a channel valley ($m_{zv}$);
assigning a plurality of differing values for each of the remaining model variables; and
determining, for each of the plurality of differing values, a current value ($I_{12}$) from a rate equation modeled after the source-channel barrier;
wherein the rate equation comprises:

$$I_{12} = 2qW/\hbar^2 (kT/2\Pi)^{3/2} \Sigma e^{(F_1 - E^{qv} - V^o)/kT} \sqrt{m_{zv}}.$$

12. An apparatus for simulating current-voltage behavior in a semiconductor device having a source region, a channel region and a drain region, comprising:
a processor;
a memory connected to the processor, the memory storing a program to control the operation of the processor; and
the processor being operative with the program to:
receive an input including one of a plurality of fixed values for each of at least one of a plurality of model variables including a gate-to-source voltage ($V_{GS}$) to be applied to the device, a drain-to source voltage ($V_{DS}$) to be applied to the device, a first Fermi level ($F_1$) corresponding to the source region of the device, a second Fermi level ($F_2$) corresponding to the channel region of the device, a width (W) of the channel region, an operating temperature (T) of the device, a quantization energy level ($E_{qv}$) of the device, a height (Vo) of a source-channel barrier of the device, and a mass in a z-direction for an electron in a channel valley ($m_{zv}$);
assign a plurality of differing values for each of the remaining model variables;
the model being free of reliance on transport phenomena, including electron mobility, diffusion and velocity as variables; and
determine, for each of the plurality of differing values, a current value ($I_{12}$) from a rate equation modeled after the source-channel barrier.

13. The apparatus of claim 12, wherein the processor is further operative with the program to:
display the current value to a user via an output device.

14. An apparatus for simulating current-voltage behavior in a semiconductor device having a source region, a channel region and a drain region, comprising:

a processor;

a memory connected to the processor, the memory storing a program to control the operation of the processor; and the processor being operative with the program to:

receive an input including one of a plurality of fixed values for each of at least one of a plurality of model variables including a gate-to-source voltage ($V_{GS}$) to be applied to the device, a drain-to source voltage ($V_{DS}$) to be applied to the device, a first Fermi level ($F_1$) corresponding to the source region of the device, a second Fermi level ($F_2$) corresponding to the channel region of the device, a width (W) of the channel region, an operating temperature (T) of the device, a quantization energy level ($E_{qv}$) of the device, a height (Vo) of a source-channel barrier of the device, and a mass in a z-direction for an electron in a channel valley ($m_{zv}$);

assign a plurality of differing values for each of the remaining model variables; and determine, for each of the plurality of differing values, a current value ($I_{12}$) from a rate equation modeled after the source-channel barrier;

wherein the rate equation comprises:

$I_{12} = 2qW/\hbar^2 (kT/2\Pi)^{3/2} \Sigma e^{(F^1 - E^{qv} - V^o)/kT} \sqrt{m_{zv}}$.

* * * * *